United States Patent
Rettberg et al.

(10) Patent No.: US 12,104,227 B2
(45) Date of Patent: Oct. 1, 2024

(54) HIGH TEMPERATURE COMBUSTOR AND VANE ALLOY

(71) Applicant: Raytheon Technologies Corporation, Farmington, CT (US)

(72) Inventors: Luke H. Rettberg, West Hartford, CT (US); Alan D. Cetel, West Hartford, CT (US)

(73) Assignee: RTX Corporation, Farmington, CT (US)

( * ) Notice: Subject to any disclaimer, the term of this patent is extended or adjusted under 35 U.S.C. 154(b) by 0 days.

(21) Appl. No.: 17/403,146

(22) Filed: Aug. 16, 2021

(65) Prior Publication Data

US 2022/0119923 A1 Apr. 21, 2022

Related U.S. Application Data

(63) Continuation of application No. 16/783,662, filed on Feb. 6, 2020, now abandoned, which is a continuation-in-part of application No. 16/715,463, filed on Dec. 16, 2019, now abandoned.

(60) Provisional application No. 62/802,909, filed on Feb. 8, 2019.

(51) Int. Cl.
*C22C 19/05* (2006.01)
*F01D 5/28* (2006.01)

(52) U.S. Cl.
CPC ............ *C22C 19/057* (2013.01); *F01D 5/288* (2013.01); *F05D 2220/32* (2013.01); *F05D 2300/175* (2013.01)

(58) Field of Classification Search
CPC ................... C22C 19/057; C22F 1/10
See application file for complete search history.

(56) References Cited

U.S. PATENT DOCUMENTS

| | | | |
|---|---|---|---|
| 4,719,080 A | 1/1988 | Duhl et al. | |
| 4,801,513 A | 1/1989 | Duhl et al. | |
| 5,916,382 A | 6/1999 | Sato et al. | |
| 9,816,161 B2 | 11/2017 | Kawagishi et al. | |
| 2005/0271886 A1 | 12/2005 | Cetel | |
| 2008/0240926 A1 | 10/2008 | Kobayashi et al. | |
| 2010/0254822 A1 | 10/2010 | Hazel et al. | |
| 2011/0256421 A1 | 10/2011 | Bose et al. | |

FOREIGN PATENT DOCUMENTS

EP 0971041 A1 1/2000

OTHER PUBLICATIONS

European Office action dated Oct. 19, 2021 for European Patent Application No. 20156465.5.
Tian Sugui et al., "Influence of Element Re on Lattice Misfits and Stress Rupture Properties of Single Crystal Nickel-Based Superalloys", Materials Science and Engineering A, Jun. 25, 2010, pp. 4458-4465, vol. 527, Elsevier, Amsterdam, the Netherlands.

(Continued)

*Primary Examiner* — Jessee R Roe
(74) *Attorney, Agent, or Firm* — Bachman & LaPointe, P.C.

(57) ABSTRACT

An alloy comprises, by weight: nickel (Ni) as a largest constituent; 6.0% to 7.5% chromium; up to 5.0% cobalt; 5.3% to 6.5% aluminum; up to 5.0% rhenium; 3.7% to 7.0% tungsten; and 3.7% to 7.0% tantalum.

20 Claims, 2 Drawing Sheets

(56) References Cited

OTHER PUBLICATIONS

Tian Sugui et al., "Influence of TCP Phase and its Morphology on Creep Properties of Single Crystal Nickel-Based Superalloys", Materials Science and Engineering A, Aug. 20, 2010, pp. 5444-5451, vol. 527, Elsevier, Amsterdam, the Netherlands.
Tian Sugui et al., "Evolution and Analysis of TCP Phase in a Single Crystal Nickel-Based Superalloy Containing Re During Aging", Rare Metals, Mar. 1, 2011, pp. 452-456, vol. 30, Springer, New York, New York.
European Search Report dated Apr. 28, 2020 for European Patent Application No. 20156465.5.
Office action dated Jan. 12, 2021 for U.S. Appl. No. 16/783,662.
Office action dated Apr. 15, 2021 for U.S. Appl. No. 16/783,662.
European Search Report dated Jun. 4, 2024 for European Patent Application No. 24155256.1.

US 12,104,227 B2

HIGH TEMPERATURE COMBUSTOR AND VANE ALLOY

CROSS-REFERENCE TO RELATED APPLICATION

This is a continuation-in-part of U.S. patent application Ser. No. 16/715,463, now abandoned, filed Dec. 18, 2019, and entitled "High Temperature Combustor and Vane Alloy", which claims benefit of U.S. Patent Application No. 62/802,909, filed Feb. 8, 2019, and entitled "High Temperature Combustor and Vane Alloy", the disclosure of which is incorporated by reference herein in its entirety as if set forth at length.

BACKGROUND

The disclosure relates to nickel-based superalloys. More particularly, the disclosure relates to alloys for combustor and vane applications.

Gas turbine engine hot section components are commonly formed of alloys, typically nickel- or cobalt-based superalloys. Many components, such as blades are formed of single crystal (SX) alloys. In such single crystal components, essentially the entire component is formed of a single continuous crystal lattice. Typically, the orientation of that lattice is predetermined to achieve desired properties of the component. The orientation may be assured by use of a grain starter or other casting techniques.

When contrasted with other components such as vanes and combustor panels, blades experience significant inertial loading. Thus, blade alloy compositions are typically specialized and differ from vane and combustor panel alloy compositions.

Whether used on blades or on non-rotating components such as vanes and combustor panels, the alloy substrates are typically actively cooled via air flows (whether via internal passageways as in typical blades and vanes or via throughhole film cooling in the case of combustor panels). Such components are also often coated with thermal barrier coatings (TBC). Typical thermal barrier coatings include a bondcoat (e.g., an MCrAlY) and a barrier coat (e.g., a ceramic such as a stabilized zirconia).

Typical failure mechanisms for such hot section components involve oxidation of the metallic substrate. Oxidation may also be accompanied by melting, particularly at hot spots. Such failures may cause spalling of the TBC, which further increases thermal loads and impetus toward oxidation and melting.

SUMMARY

One aspect of the disclosure involves an alloy comprising, by weight: nickel (Ni) as a largest constituent; 6.0% to 7.5% chromium; up to 5.0% cobalt; 5.3% to 6.5% aluminum; up to 5.0% rhenium; 3.7% to 7.0% tungsten; and 3.7% to 7.0% tantalum.

A further embodiment of any of the foregoing embodiments may additionally and/or alternatively include the alloy comprising, by weight: nickel (Ni) as said largest constituent; 6.0% to 7.0% chromium; up to 5.0% cobalt; 5.4% to 6.4% aluminum; 2.8% to 3.2% rhenium; 3.8% to 6.0% tungsten; and 3.8% to 6.0% tantalum.

A further embodiment of any of the foregoing embodiments may additionally and/or alternatively include the alloy comprising, by weight: nickel (Ni) as said largest constituent; 6.8% to 7.5% chromium; up to 0.5% cobalt; 5.3% to 6.5% aluminum; up to 3.25% rhenium; 3.7% to 7.0% tungsten; 3.7% to 7.0% tantalum; and up to 0.30% silicon.

A further embodiment of any of the foregoing embodiments may additionally and/or alternatively include the alloy comprising, by weight: nickel (Ni) as said largest constituent; 6.7% to 7.5% chromium; up to 0.5% cobalt; 5.3% to 6.5% aluminum; up to 3.25% rhenium; 3.7% to 7.0% tungsten; 3.7% to 7.0% tantalum; and up to 0.30% silicon.

A further embodiment of any of the foregoing embodiments may additionally and/or alternatively include the alloy comprising, by weight: nickel (Ni) as said largest constituent; 6.75% to 7.25% chromium; up to 0.5% cobalt; 5.9% to 6.4% aluminum; 2.6% to 3.2% rhenium; 3.8% to 6.2% tungsten; 3.8% to 6.2% tantalum; and up to 0.30% silicon.

A further embodiment of any of the foregoing embodiments may additionally and/or alternatively include the alloy, wherein by weight: a molybdenum content, if any, is no more than 0.50%; a sulfur content, if any, is no more than 5 ppm; a hafnium content, if any is no more than 0.50%; and a carbon content, if any, is no more than 0.10%.

A further embodiment of any of the foregoing embodiments may additionally and/or alternatively include, by weight, one or more of: a molybdenum content, if any, being no more than 0.50%; a sulfur content, if any, being no more than 5 ppm; a hafnium content, if any being no more than 0.50%; a silicon content, if any, being no more than 0.50%; and a carbon content, if any, being no more than 0.10%.

A further embodiment of any of the foregoing embodiments may additionally and/or alternatively include, by weight, one or more of: a molybdenum content, if any, being no more than 0.10%; a sulfur content, if any, being no more than 1 ppm; a hafnium content being 0.050% to 0.15%; a silicon content, if any, being no more than 0.30%; and a carbon content, if any, being no more than 0.10%.

A further embodiment of any of the foregoing embodiments may additionally and/or alternatively include, by weight: a combined content, if any, of elements other than nickel, chromium, cobalt, aluminum, rhenium, tungsten, tantalum, molybdenum, if any, sulfur, if any, hafnium, if any, silicon, if any, and carbon, if any, being no more than 2.0%.

A further embodiment of any of the foregoing embodiments may additionally and/or alternatively include, by weight: a combined content, if any, of elements other than nickel, chromium, cobalt, aluminum, rhenium, tungsten, tantalum, molybdenum, if any, sulfur, if any, hafnium, if any, silicon, if any, and carbon, if any, being no more than 1.0%.

A further embodiment of any of the foregoing embodiments may additionally and/or alternatively include, by weight: an individual content, if any, of every element other than nickel, chromium, cobalt, aluminum, rhenium, tungsten, tantalum, molybdenum, if any, sulfur, if any, hafnium, if any, silicon, if any, and carbon, if any, being no more than 1.0%.

A further embodiment of any of the foregoing embodiments may additionally and/or alternatively include, by weight: an individual content, if any, of every element other than nickel, chromium, cobalt, aluminum, rhenium, tungsten, tantalum, molybdenum, if any, sulfur, if any, hafnium, if any, silicon, if any, and carbon, if any, being no more than 0.20%.

A further embodiment of any of the foregoing embodiments may additionally and/or alternatively include, by weight: the combined content of chromium, cobalt, and aluminum being 11.5% to 16.0%.

A further embodiment of any of the foregoing embodiments may additionally and/or alternatively include, by weight: the combined content of chromium, cobalt, and aluminum being 11.5% to 14.0%.

A further embodiment of any of the foregoing embodiments may additionally and/or alternatively include, by weight: the combined content of tungsten and tantalum being 8.0% to 14.0%.

A further embodiment of any of the foregoing embodiments may additionally and/or alternatively include, by weight: the combined content of tungsten and tantalum being 9.0% to 11.0%.

A further embodiment of any of the foregoing embodiments may additionally and/or alternatively include, by weight: the combined content of rhenium, tungsten, and tantalum being 9.0% to 15.0%.

A further embodiment of any of the foregoing embodiments may additionally and/or alternatively include, by weight: the combined content of rhenium, tungsten, and tantalum being 10.0% to 13.0%.

A further embodiment of any of the foregoing embodiments may additionally and/or alternatively include, by weight: yttrium, lanthanum, and/or cerium up to 0.15% combined.

A further embodiment of any of the foregoing embodiments may additionally and/or alternatively include the alloy having an incipient melting temperature of at least 2440° F. (1338° C.).

A further embodiment of any of the foregoing embodiments may additionally and/or alternatively include the alloy having an incipient melting temperature of at least 2460° F. (1349° C.).

A further embodiment of any of the foregoing embodiments may additionally and/or alternatively include the alloy having an incipient melting temperature of 2460° F. to 2520° F. (1349° C. to 1382° C.) in single-crystal (SX) form.

A further embodiment of any of the foregoing embodiments may additionally and/or alternatively include the alloy in single-crystal (SX) form.

A further embodiment of any of the foregoing embodiments may additionally and/or alternatively include a gas turbine engine component (e.g., a combustor panel or a vane) comprising a substrate formed of the alloy.

A further embodiment of any of the foregoing embodiments may additionally and/or alternatively include the combustor panel further comprising: mounting studs.

A further embodiment of any of the foregoing embodiments may additionally and/or alternatively include the combustor panel further comprising: a thermal barrier coating atop the substrate.

A further embodiment of any of the foregoing embodiments may additionally and/or alternatively include the substrate being formed as a frustoconical segment.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
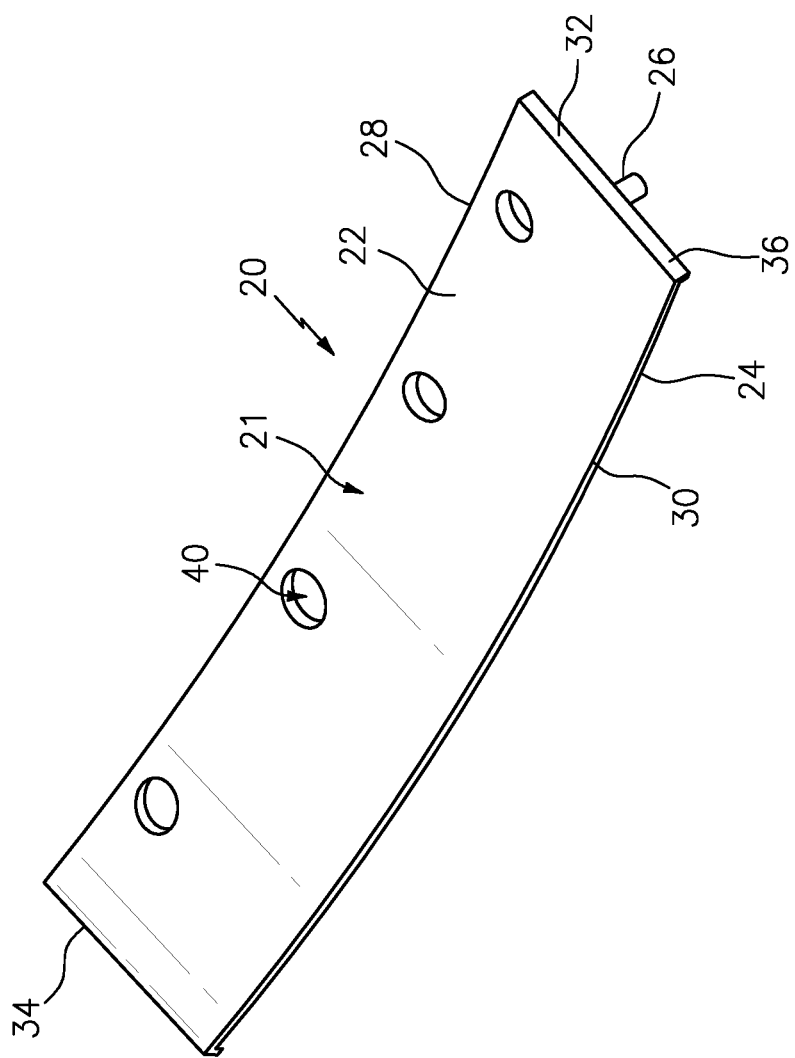
FIG. 1 is a view of a gas turbine engine combustor panel.

FIG. 1 shows a turbine engine combustor panel 20 which, for purposes of illustration is based on the combustor panel of U.S. Pat. No. 8,216,687, of Burd et al., Jul. 10, 2012, and entitled "Thermal barrier coating". The exemplary panel 20, may be formed having a body 21 shaped as a generally frustoconical segment having inboard and outboard surfaces 22 and 24. The exemplary panel is configured for use in an annular combustor circumscribing the engine centerline. In the exemplary panel, the inboard surface 22 forms an interior surface (i.e., facing the combustor interior) so that the panel is an outboard panel. For an inboard panel, the inboard surface would be the exterior surface. Accordingly, mounting features such as studs 26 extend from the outboard surface for securing the panel relative to the engine. The exemplary panel further includes an upstream/leading edge 28, a downstream/trailing edge 30 and lateral edges 32 and 34. Along the edges or elsewhere, the panel may include rails or standoffs 36 extending from the exterior surface 24 for engaging a combustor shell (not shown). The exemplary panel includes a circumferential array of large apertures 40 for the introduction of process air. Smaller apertures (not shown) may be provided for film cooling. Moreover, select panels may accommodate other openings for spark plug or igniter placement. Nevertheless, the teachings herein may be applied to other parts of other annular combustors, can-type combustors, and the like, as well as vanes, fuel nozzles, and other components.

Figure 2:
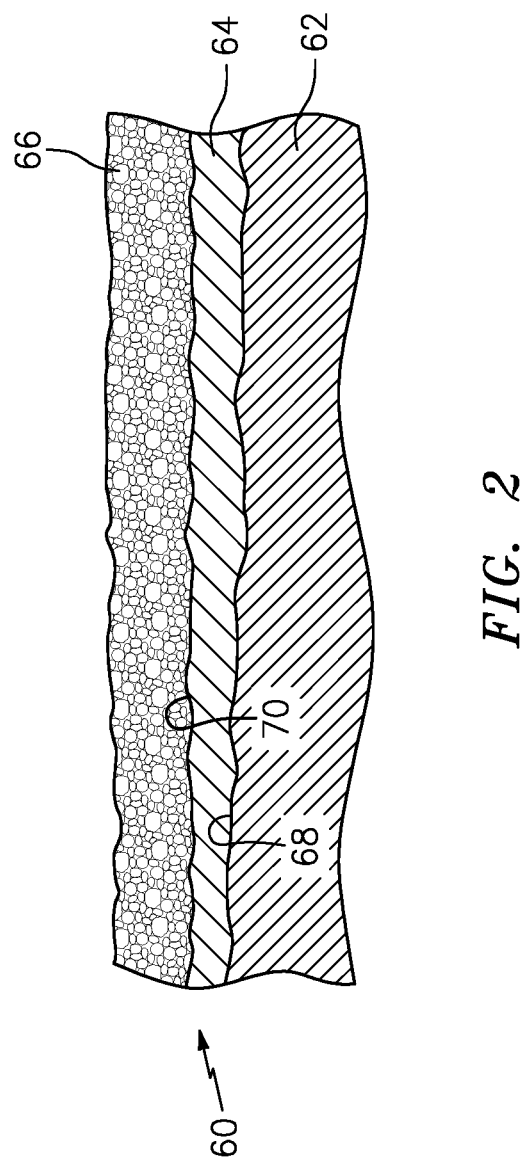
FIG. 2 is a partially schematic cross-sectional view of a coating system on the panel of FIG. 1.

FIG. 2 shows a basic coating system 60 atop a superalloy substrate 62. The system may include a bondcoat 64 atop the substrate 62 and a TBC 66 atop the bondcoat 64. In an exemplary process, the bondcoat 64 is deposited atop the substrate surface 68. One exemplary bondcoat is a MCrAlY which may be deposited by a thermal spray process (e.g., air plasma spray) or by an electron beam physical vapor deposition (EBPVD) process. An alternative bondcoat is a diffusion aluminide deposited by vapor phase aluminizing (VPA). An exemplary characteristic (e.g., mean or median) bondcoat thicknesses 4-9 mil (100-230 micrometer). Again, other coating systems, if any, may be used. The TBC may be directly atop a surface 70 of the bondcoat 64 or of a thermally grown oxide (TGO) formed atop the bondcoat.

Several candidate alloys for improved high temperature oxidation performance were hypothesized and were manufactured. Table I lists compositions of ten candidate alloys plus two known prior art alloys ("Prior Art 1" and "Prior Art 2"). The prior art alloys are high cobalt, high tantalum, alloys differing from each other in that one has relatively low sulfur content. Low sulfur content is regarded as generally desirable in high temperature alloys. The ten listed candidate alloys all have somewhat higher sulfur concentrations than Prior Art 2 due to the limitations of laboratory-scale manufacture techniques. As is discussed below, commercial scale implementation may desirably have lower sulfur.

For purposes of an initial screening test, the candidate alloys of Table I were processed as equiax buttons. The buttons (and a button of the higher sulfur Prior Art 1) were subject to cyclic furnace oxidation testing at 2300° F. (1260° C.). Exemplary test parameters were 260 cycles with a cycle time of just over 1 hour between a 2300° F. (1260° C.) hot zone (45 minute hold), a room temperature cool zone (7 minutes), and a ramp back up to 2300° F. (1260° C.) (14 minutes).

Table II shows the results of the cyclic furnace oxidation testing. To provide an apples-to-apples comparison, sulfur concentration needed to be adjusted to compensate for variations in the incidental level of sulfur amongst the test samples. Based upon known sulfur effects, the experimentally-derived adjustment factor of Table II was applied to make all ten candidates directly comparable to the Prior Art 2. From this test data, it is seen that alloys D, F, G, and J are particularly promising in all having projected life benefits in excess of five times that of the baseline Prior Art 2. Alloys E and H are still somewhat promising at over four times but slightly under five times.

A 2250° F. (1232° C.) burner rig oxidation test was performed on these alloys. Exemplary parameters are 57 minutes in burner flame and 3 minutes outside the flame over a total of 933 cycles.

TABLE I

Candidate and Prior Art Alloy Compositions
(by weight - percent except where noted)

| Alloy | Ni | Cr | Co | Al | Mo | W | Ta | Re | Hf | Si | S (ppm) |
|---|---|---|---|---|---|---|---|---|---|---|---|
| A | Bal | 5.16 | 5.17 | 5.59 | 0.01 max. | 3.79 | 4.01 | 2.57 | 0.09 | 0.01 max. | 2.9 |
| B | Bal | 5.14 | 0.01 max. | 6.16 | 0.01 max. | 5.72 | 5.99 | 2.84 | 0.10 | 0.01 max. | 2.6 |
| C | Bal | 5.15 | 5.12 | 6.17 | 0.01 max. | 5.62 | 5.98 | 2.75 | 0.09 | 0.01 max. | 3.2 |
| D | Bal | 6.15 | 0.01 max. | 5.49 | 0.01 max. | 3.96 | 4.03 | 2.84 | 0.07 | 0.01 max. | 2.3 |
| E | Bal | 6.09 | 5.16 | 5.47 | 0.01 max. | 4.08 | 4.01 | 2.92 | 0.08 | 0.01 max. | 2.0 |
| F | Bal | 6.17 | 0.01 max. | 5.57 | 0.01 max. | 5.45 | 4.03 | 2.68 | 0.09 | 0.01 max. | 2.2 |
| G | Bal | 6.09 | 5.09 | 6.11 | 0.01 max. | 4.08 | 3.94 | 3.24 | 0.09 | 0.01 max. | 3.9 |
| H | Bal | 6.13 | 0.01 max. | 6.21 | 0.01 max. | 4.01 | 3.99 | 2.84 | 0.09 | 0.01 max. | 3.9 |
| I | Bal | 7.13 | 5.11 | 6.19 | 0.01 max. | 4.06 | 4.01 | 2.83 | 0.09 | 0.01 max. | 6.1 |
| J | Bal | 7.15 | 0.01 max. | 6.19 | 0.01 max. | 4.02 | 4.03 | 2.68 | 0.10 | 0.01 max. | 3.8 |
| Prior Art 1 | Bal | 5.16 | 10.31 | 5.70 | 1.93 | 5.90 | 8.64 | 2.86 | 0.10 | 0.01 max. | 4.2 |
| Prior Art 2 | Bal | 5.16 | 10.31 | 5.70 | 1.93 | 5.90 | 8.64 | 2.86 | 0.10 | 0.01 max. | 0.9 |

Alloys A-J being measured compositions (except for Mo and Si which are specification)
Prior Art 1 and 2 being nominal specification

TABLE II

2300 F. Cyclic Furnace Oxidation Test

| Alloy | Metal Loss mils (mm) | Hours/Mil | S (ppm) | Adjusted Hours/Mil | Life Benefit** | Incipient Melting Temperature (° F. (° C.)) |
|---|---|---|---|---|---|---|
| A | 43.2 (1.10) | 6.0 | 2.9 | 11.9 | .78× | >2500 (1371) |
| B | 19.5 (0.50) | 13.3 | 2.6 | 24.7 | 1.63× | 2495 (1368) |
| C | 18.4 (0.47) | 14.1 | 3.2 | 29.6 | 1.95× | 2495 (1368) |
| D | 3.0 (0.076) | 86.7 | 2.3 | 150 | 9.87× | >2500 (1371) |
| E | 5.5 (0.14) | 47.3 | 2.0 | 75.2 | 4.95× | >2500 (1371) |
| F | 3.3 (0.084) | 78.8 | 2.2 | 125.3 | 8.24× | >2500 (1371) |
| G | 3.6 (0.091) | 72.2 | 3.9 | 170.4 | 11.21× | 2490 (1366) |
| H | 8.2 (0.21) | 31.7 | 3.9 | 74.8 | 4.92× | 2490 (1366) |
| I | 24.1 (0.61) | 10.8 | 6.1 | 33.2 | 2.18× | 2490 (1366) |
| J | 5.2 (0.13) | 50.0 | 3.8 | 116.5 | 7.66× | 2490 (1366) |
| Prior Art 1 | 42.1 (1.07) | 6.2 | 4.2 | 15.2 | | 2440 (1338) |
| Prior Art 2 | 17.1 (0.43) est | 15.2 est | 0.9 | 15.2 est | 1× | 2440 (1338) |

**Normalized relative to Prior Art 2 S content.

New specimens of those four most promising alloys plus a further Alloy K were processed as cast single crystal alloys. Their respective compositions are shown in Table III below. Alloy K was selected to be fairly close to alloy D in composition but having a slightly higher silicon content. This silicon content was selected to evaluate the oxidation vs. melting temperature tradeoff. Observed reduction in incipient melting temperature (still substantially greater than the prior art incipient melting temperature) is worth the increased oxidation life.

As seen in Table III below, particularly significant advantages were found for alloys D, J, and K.

Differences in observed incipient melting temperature between Tables II and III are accounted for principally by the equiax vs. single-crystal (SX) state and minor compositional variation.

Based upon these relatively significant life and temperature range benefits, Table IV below shows various candidate compositional ranges. Alternative ranges may be created by recombining within a group (i.e., ranges are identified with a number identifying a group of ranges and a letter identifying a particular range in that group as in "Range 1A") the identified ranges of elements from different particular ranges. Thus, for example, Range 1B may be modified by choosing one or more individual element ranges from any of Ranges 1A and 1C-1F (e.g., the 1A range of W and the 1C range of Ta, etc.).

A further variation is to increase at least one of rhenium, tungsten, and tantalum. If the intended application is not creep limited, the basic ranges would suffice. With higher creep capability requirements the rhenium, tungsten and/or tantalum could be increased. Particular examples may be vanes where pressure differential or structural loading requires creep strength. Re suffers cost issues, thus, the increased content may be all from W and/or Ta if cost is an issue. Total W and Ta could be up to 14.0 weight percent or up to 12.0 weight percent or up to 11.0 weight percent; complementary lower limits may be 8.0 weight percent or 9.0 weight percent. Individual contents of each could additionally or alternatively be up to 8.0 weight percent or 7.0 weight percent or 6.0 weight percent. Increased Re up to 5.0 weight percent or 4.0 weight percent is possible. Such upper limits on Re, Ta, and/or W may be substituted into Table IV below to create alternative ranges. Combined Re, W, and Ta may be in the range of 9.0 weight percent to 15.0 weight percent, more narrowly 10.0 weight percent to 13.0 weight percent. Candidates for such higher Re, W, and/or Ta alloys are shown in Table V below.

The combined oxidation and melting performance is believed related to a combined content of chromium, cobalt, and aluminum. An exemplary minimum combined content of chromium, cobalt, and aluminum is 11.0 weight percent or 11.5 weight percent. An exemplary maximum is 16.0 weight percent or 14.0 weight percent. Too much could reduce melting temperature and introduce microstructural instability. Too little could reduce oxidation performance.

Small amounts of elements such as yttrium, lanthanum, and/or cerium are known in the art as improving oxidation resistance. An exemplary combined content of Y, La, and Ce, if any is up to 0.15% or 0.10% by weight.

In various embodiments, combined content, if any, of elements other than nickel, chromium, cobalt, aluminum, rhenium, tungsten, tantalum, molybdenum, if any, sulfur, if any, hafnium, if any, silicon, if any, and carbon, if any, being no more than 2.0% or no more than 1.0% or no more than inevitable or commercial impurity levels. Or a combined content of such elements and Y, La, and Ce, if any may be no more than inevitable or commercial impurity levels.

TABLE III

2250° F. Burner Rig Oxidation Test

| | Component (by weight - percent except where noted) | | | | | | | | | | Test | | |
|---|---|---|---|---|---|---|---|---|---|---|---|---|---|
| Alloy | Ni | Cr | Co | Al | Mo | W | Ta | Re | Hf | Si | S ppm | Wt Loss | Life Benefit | Incipient Melting Temperature (° F. (° C.)) |
| D | Bal | 6.21 | 0.04 | 5.42 | 0.01 | 4.04 | 4.04 | 3.00 | 0.13 | 0.02 | 0.93 | 814 | 1.61× | 2515 (1379) |
| F | Bal | 6.22 | 0.02 | 5.61 | 0.01 | 5.41 | 4.05 | 3.02 | 0.11 | 0.03 | 0.43 | 539 | 1.07× | 2505 (1374) |
| G | Bal | 6.22 | 4.90 | 6.33 | 0.01 | 3.95 | 4.03 | 3.04 | 0.10 | 0.03 | 2.10 | 594 | 1.18× | 2495 (1368) |
| J | Bal | 6.91 | 0.01 | 6.18 | 0.01 | 3.99 | 4.02 | 3.00 | 0.11 | 0.03 | 0.91 | 879 | 1.74× | 2475 (1357) |
| K | Bal | 6.23 | 0.01 | 5.45 | 0.01 | 3.89 | 3.98 | 2.97 | 0.12 | 0.24 | 0.98 | 1534 | 3.04× | 2495 (1368) |
| Prior Art 2 | Bal | 4.98 | 10.02 | 5.63 | 1.88 | 5.87 | 8.71 | 3.00 | 0.09 | 0.03 | 0.30 | 505 | 1× | 2440 (1338) |

All (including Prior Art 2) being measured compositions.

TABLE IV

Candidate Compositional Ranges (by weight - percent except where noted)

| Alloy | Ni | Cr | Co | Al | Re | Mo | W | Ta | Hf | Si | C | S |
|---|---|---|---|---|---|---|---|---|---|---|---|---|
| Range 1A | Bal | 6.0-7.5 | to 5.0 | 5.3-6.5 | to 5.0 | to 0.50 | 3.7-7.0 | 3.7-7.0 | 0.050-0.50 | to 0.30 | to 0.10 | to 5 ppm |
| Range 1B | Bal | 6.0-7.0 | to 5.0 | 5.4-6.4 | 2.8-3.2 | to 0.10 | 3.8-6.0 | 3.8-6.0 | 0.050-0.15 | to 0.30 | to 0.050 | to 1 ppm |
| Range 1C | Bal | 6.0-7.5 | to 5.0 | 5.3-6.5 | to 5.0 | to 0.50 | 3.7-5.6 | 3.7-4.4 | 0.050-0.50 | to 0.30 | to 0.10 | to 5 ppm |
| Range 1D | Bal | 6.0-7.0 | to 5.0 | 5.4-6.4 | 2.8-3.2 | to 0.10 | 3.8-5.5 | 3.8-4.2 | 0.050-0.15 | to 0.30 | to 0.050 | to 1 ppm |
| Range 1E | Bal | 6.0-7.5 | to 5.0 | 5.3-6.5 | 2.5-3.3 | to 0.50 | 3.7-5.6 | 4.2-5.2 | 0.050-0.50 | to 0.30 | to 0.10 | to 5 ppm |
| Range 1F | Bal | 6.0-7.0 | to 5.0 | 5.4-6.4 | 2.8-3.2 | to 0.10 | 3.8-5.5 | 4.4-5.1 | 0.050-0.15 | to 0.30 | to 0.050 | to 1 ppm |
| Range 1G | Bal | 6.0-7.2 | to 5.0 | 5.3-6.4 | to 5.0 | to 0.50 | 3.7-7.0 | 3.7-7.0 | 0.050-0.50 | to 0.30 | to 0.10 | to 5 ppm |
| Range 2A | Bal | 6.0-7.5 | to 0.5 | 5.3-6.5 | to 3.25 | to 0.50 | 3.7-7.0 | 3.7-7.0 | 0.050-0.50 | to 0.30 | to 0.10 | to 5 ppm |
| Range 2B | Bal | 6.0-7.0 | to 0.1 | 5.4-6.4 | 2.8-3.2 | to 0.10 | 3.8-6.0 | 3.8-6.0 | 0.050-0.15 | 0.15 to 0.25 | to 0.050 | to 1 ppm |
| Range 2C | Bal | 6.0-7.5 | to 0.5 | 5.3-6.5 | to 3.25 | to 0.50 | 3.7-5.6 | 3.7-4.4 | 0.050-0.50 | to 0.30 | to 0.10 | to 5 ppm |
| Range 2D | Bal | 6.0-7.0 | to 0.1 | 5.4-6.4 | 2.8-3.2 | to 0.10 | 3.8-5.5 | 3.8-4.2 | 0.050-0.15 | 0.15 to 0.25 | to 0.050 | to 1 ppm |
| Range 2E | Bal | 6.0-7.5 | to 0.5 | 5.3-6.5 | to 3.25 | to 0.50 | 3.7-5.6 | 4.2-5.2 | 0.050-0.50 | to 0.30 | to 0.10 | to 5 ppm |
| Range 2F | Bal | 6.0-7.0 | to 0.1 | 5.4-6.4 | 2.8-3.2 | to 0.10 | 3.8-5.5 | 4.4-5.1 | 0.050-0.15 | 0.15 to 0.25 | to 0.050 | to 1 ppm |
| Range 3A | Bal | 6.0-7.5 | to 0.5 | 5.3-6.5 | to 3.25 | to 0.50 | 3.7-4.4 | 3.7-7.0 | 0.050-0.50 | to 0.30 | to 0.10 | to 5 ppm |
| Range 3B | Bal | 6.0-7.0 | to 0.1 | 5.4-6.4 | 2.8-3.2 | to 0.10 | 3.8-4.2 | 3.8-6.0 | 0.050-0.15 | 0.15 to 0.25 | to 0.050 | to 1 ppm |
| Range 3C | Bal | 6.0-7.5 | to 0.5 | 5.3-6.5 | to 3.25 | to 0.50 | 3.7-4.4 | 3.7-4.4 | 0.050-0.50 | to 0.30 | to 0.10 | to 5 ppm |
| Range 3D | Bal | 6.0-7.0 | to 0.1 | 5.4-6.4 | 2.8-3.2 | to 0.10 | 3.8-4.2 | 3.8-4.2 | 0.050-0.15 | 0.15 to 0.25 | to 0.050 | to 1 ppm |
| Range 3E | Bal | 6.0-7.5 | to 0.5 | 5.3-6.5 | to 3.25 | to 0.50 | 3.7-4.4 | 4.2-5.2 | 0.050-0.50 | to 0.30 | to 0.10 | to 5 ppm |
| Range 3F | Bal | 6.0-7.0 | to 0.1 | 5.4-6.4 | 2.8-3.2 | to 0.10 | 3.8-4.2 | 4.4-5.1 | 0.050-0.15 | 0.15 to 0.25 | to 0.050 | to 1 ppm |
| Range 4A | Bal | 6.8-7.5 | to 0.5 | 5.3-6.5 | to 3.25 | to 0.50 | 3.7-7.0 | 3.7-7.0 | 0.050-0.50 | to 0.30 | to 0.10 | to 5 ppm |

TABLE IV-continued

Candidate Compositional Ranges (by weight - percent except where noted)

| Alloy | Ni | Cr | Co | Al | Re | Mo | W | Ta | Hf | Si | C | S |
|---|---|---|---|---|---|---|---|---|---|---|---|---|
| Range 4B | Bal | 7.0-7.5 | to 0.1 | 5.4-6.4 | 2.8-3.2 | to 0.10 | 3.8-6.0 | 3.8-6.0 | 0.050-0.15 | 0.15 to 0.25 | to 0.050 | to 1 ppm |
| Range 4C | Bal | 6.8-7.5 | to 0.5 | 5.3-6.5 | to 3.25 | to 0.50 | 3.7-5.6 | 3.7-4.4 | 0.050-0.50 | to 0.30 | to 0.10 | to 5 ppm |
| Range 4D | Bal | 7.0-7.5 | to 0.1 | 5.4-6.4 | 2.8-3.2 | to 0.10 | 3.8-5.5 | 3.8-4.2 | 0.050-0.15 | 0.15 to 0.25 | to 0.050 | to 1 ppm |
| Range 4E | Bal | 6.8-7.5 | to 0.5 | 5.3-6.5 | to 3.25 | to 0.50 | 3.7-5.6 | 4.2-5.2 | 0.050-0.50 | to 0.30 | to 0.10 | to 5 ppm |
| Range 4F | Bal | 7.0-7.5 | to 0.1 | 5.4-6.4 | 2.8-3.2 | to 0.10 | 3.8-5.5 | 4.4-5.1 | 0.050-0.15 | 0.15 to 0.25 | to 0.050 | to 1 ppm |
| Range 4G | Bal | 6.8-7.2 | to 0.5 | 6.0-6.4 | 2.9-3.25 | to 0.50 | 3.7-4.2 | 3.7-4.2 | 0.050-0.50 | to 0.30 | to 0.10 | to 5 ppm |
| Range 4H | Bal | 6.7-7.5 | to 0.5 | 5.3-6.5 | to 3.25 | to 0.50 | 3.7-7.0 | 3.7-7.0 | 0.050-0.50 | to 0.30 | to 0.10 | to 5 ppm |
| Range 4I | Bal | 7.0-7.5 | to 0.1 | 5.4-6.4 | 2.7-3.2 | to 0.10 | 3.8-6.2 | 3.8-6.2 | 0.050-0.15 | 0.15 to 0.30 | to 0.050 | to 1 ppm |
| Range 4J | Bal | 6.7-7.5 | to 0.5 | 5.3-6.5 | to 3.25 | to 0.50 | 3.7-5.6 | 3.7-4.4 | 0.050-0.50 | to 0.30 | to 0.10 | to 5 ppm |
| Range 4K | Bal | 7.0-7.5 | to 0.1 | 5.4-6.4 | 2.7-3.2 | to 0.10 | 3.8-5.5 | 3.8-4.2 | 0.050-0.15 | 0.15 to 0.30 | to 0.050 | to 1 ppm |
| Range 4L | Bal | 6.7-7.5 | to 0.5 | 5.3-6.5 | to 3.25 | to 0.50 | 3.7-5.6 | 4.2-5.2 | 0.050-0.50 | to 0.30 | to 0.10 | to 5 ppm |
| Range 4M | Bal | 7.0-7.5 | to 0.1 | 5.4-6.4 | 2.7-3.2 | to 0.10 | 3.8-5.5 | 4.4-5.1 | 0.050-0.15 | 0.15 to 0.30 | to 0.050 | to 1 ppm |
| Range 4N | Bal | 6.7-7.2 | to 0.5 | 6.0-6.4 | 2.9-3.25 | to 0.50 | 3.7-4.2 | 3.7-4.2 | 0.050-0.50 | to 0.30 | to 0.10 | to 5 ppm |
| Range 5A | Bal | 6.0-6.5 | to 5.0 | 5.3-6.5 | to 3.25 | to 0.50 | 3.7-7.0 | 3.7-7.0 | 0.050-0.50 | to 0.30 | to 0.10 | to 5 ppm |
| Range 5B | Bal | 6.0-6.5 | to 0.5 | 5.3-6.5 | to 3.25 | to 0.50 | 3.7-7.0 | 3.7-7.0 | 0.050-0.50 | to 0.30 | to 0.10 | to 5 ppm |
| Range 5C | Bal | 6.0-6.5 | to 0.5 | 5.3-6.4 | 2.9-3.25 | to 0.50 | 3.7-5.5 | 3.7-4.2 | 0.050-0.50 | to 0.30 | to 0.10 | to 5 ppm |

The balance nickel is exclusive of minor additions and impurities at levels discussed below.

TABLE V

Higher Re, W, and/or Ta Candidate Alloy Compositions
(by weight - percent except where noted)

| Alloy | Ni | Cr | Co | Al | Mo | W | Ta | Re | Hf | Si | S (ppm) |
|---|---|---|---|---|---|---|---|---|---|---|---|
| L | Bal | 7.25 | 0.1 max. | 6.25 | 0.1 max. | 5.0 | 5.0 | 3.0 | 0.1 | 0.2 | 0.1 max. |
| M | Bal | 7.25 | 0.1 max. | 6.25 | 0.1 max. | 6.0 | 6.0 | 3.0 | 0.1 | 0.0 | 0.1 max. |
| N | Bal | 7.25 | 0.1 max. | 6.25 | 0.1 max. | 4.0 | 4.0 | 4.0 | 0.1 | 0.2 | 0.1 max. |
| O | Bal | 7.25 | 0.1 max. | 6.25 | 0.1 max. | 2.0 | 4.0 | 5.0 | 0.1 | 0.2 | 0.1 max. |
| P | Bal | 7.25 | 0.1 max. | 6.25 | 0.1 max. | 3.0 | 4.0 | 4.0 | 0.1 | 0.2 | 0.1 max. |
| Q | Bal | 7.25 | 0.1 max. | 6.25 | 0.1 max. | 1.0 | 5.0 | 5.0 | 0.1 | 0.2 | 0.1 max. |
| R | Bal | 7.00 | 0.1 max. | 6.00 | 0.1 max. | 5.0 | 5.0 | 3.0 | 0.1 | 0.2 | 0.1 max. |
| S | Bal | 7.00 | 0.1 max. | 6.00 | 0.1 max. | 6.0 | 6.0 | 3.0 | 0.1 | 0.0 | 0.1 max. |
| T | Bal | 7.25 | 0.1 max. | 6.25 | 0.1 max. | 4.0 | 6.0 | 3.0 | 0.1 | 0.2 | 0.1 max. |
| U | Bal | 7.25 | 0.1 max. | 6.25 | 0.1 max. | 2.0 | 7.0 | 5.0 | 0.1 | 0.2 | 0.1 max. |

To validate the Table V alloys, further alloy examples were made and tested. Table VI through Table IX show data regarding these alloys and tests. Table VI shows measured compositions of three such alloys along with nominal compositions for four prior art alloys including two of the prior art alloys discussed above. The Prior Art 1 and Prior Art 2 alloys were from different batches/heats than those previously tested. Thus, nominal values are given. In the Prior Art 1 and Prior Art 3 alloys, sulfur concentration is not controlled/limited (unlike the limits of Prior Art 2 and Prior Art 4). Experience indicates that sulfur concentration in such commercial alloys is typically four PPM or somewhat greater.

Table VII has test data for three specimens of Alloy V, three specimens of Alloy W, and two specimens each of Alloy J, Prior Art 2, and Prior Art 4. The Alloy J was from the same batch/heat/composition of Table III. For each alloy, the test results are given with average value immediately below. Prior Art 2 is used to normalize and provide relative life columns. At both 2250 F and 2150 F, time to 0.5% weight loss was measured along with time to 1% weight loss at 2150 F. For both temperatures, a metallography maximum attack was measured as the per-side combination of material loss and depth of an aluminum-depleted region therebelow. This max. attack parameter was then converted into an hours per mil life parameter. Significant life improvements are shown relative to both prior art alloys.

Such life improvements are particularly significant relative to creep and tensile strength properties (discussed below) in combustor panel, vane, and other static structures contrasted with blades. Centrifugal loading on blade airfoils and attachment roots puts a premium on creep and tensile strength properties. Combustor components (e.g., floatwall panels formed as frustoconical segments, bulkheads, nozzles, combustor cans) are generally under essentially no centrifugal loading and little or no external loading. Similarly, vanes will be under no centrifugal loading and little external loading (e.g., typically carrying a small load across an airfoil from a seal at an inner platform to an outer shroud, but sometimes functioning as structural struts or the like).

Table VIII provides creep rupture data for three specimens each of Alloys V and W and their averages along with values for Prior Art 1 and Prior Art 3. The prior art alloy data was based upon published data rather than simultaneous testing along with the other two alloys. In this case, Alloy W actually shows improved creep capability over Prior Art 3 but a debit relative to Prior Art 1. Alloy V shows a creep debit relative to both prior art alloys. Alloy W had improved creep capability over Alloy V due to a higher refractory content and gamma prime volume fraction. Such debits are immaterial for nonrotating component applications.

Table IX contains tensile property data for three specimens each of Alloy V and Alloy W at each of four temperatures along with averages for each group of specimens at each temperature. Alloy V shows a tensile debit relative to Prior Art 1 and 3. Alloy W actually shows improved tensile capability over Prior Art 3 but a debit relative to Prior Art 1. No prior art data is provided because the prior art alloys' tensile capability correlates well with the creep rupture capability. From this it is seen that both Alloys V and W display a yield strength increase as a function of temperature typical of nickel-base superalloys. At test temperatures closer to the gamma prime solvus, the tensile capability of both alloys is reduced significantly due to a lower gamma prime volume fraction. In any event, such tensile debits are immaterial for nonrotating component applications.

TABLE VI

Further Higher Re, W, and/or Ta Candidate and Prior Art Alloy Compositions
(by weight - percent except where note)

| Alloy | Ni | Cr | Co | Al | Mo | W | Ta | Re | Ti | Hf | B | Zr | C | Si | S |
|---|---|---|---|---|---|---|---|---|---|---|---|---|---|---|---|
| J | Bal | 6.91 | ** | 6.18 | ** | 3.99 | 4.02 | 3.0 | ** | 0.11 | ** | ** | 0.031 | 0.03 | 0.91 ppm |
| V | Bal | 7.07 | ** | 6.13 | ** | 4.88 | 5.05 | 2.9 | ** | 0.11 | ** | ** | 0.014 | 0.23 | 0.52 ppm |
| W | Bal | 7.13 | ** | 6.17 | ** | 5.7 | 6 | 2.92 | ** | 0.11 | ** | ** | 0.012 | 0.04 | 0.65 ppm |
| Prior Art 1 * | Bal | 5.0 | 10.0 | 5.65 | 1.9 | 5.9 | 8.7 | 3.0 | ** | 0.1 | ** | ** | ** | ** | *** |
| Prior Art 2 * | Bal | 5.0 | 10.0 | 5.65 | 1.9 | 5.9 | 8.7 | 3.0 | ** | 0.1 | ** | ** | ** | ** | 1 ppm max |
| Prior Art 3 * | Bal | 10.0 | 5.0 | 5.0 | ** | 4.0 | 12.0 | 0.0 | 1.5 | ** | ** | ** | ** | ** | *** |
| Prior Art 4 * | Bal | 8.0 | 10.0 | 6.0 | 6.0 | ** | 4.25 | 0.0 | 1.0 | 1.15 | 0.015 | 0.08 | 0.11 | ** | 1 ppm max |

\* nominal - others measured
\*\* maximum aggregate minor alloying element concentration of 0.3 wt % for each alloy
\*\*\* not controlled, typically 4 ppm or somewhat greater.

TABLE VII

Uncoated Burner Rig Oxidation Testing

| | 2250 F. | | | | | | | 2150 F. | | | | | | | |
|---|---|---|---|---|---|---|---|---|---|---|---|---|---|---|---|
| Alloy | Time (hours) | Weight Loss, (grams) | Time to 0.5% Wt. Loss (hours) | Rel. Life 0.5% Loss | Max Attack (mils) | Hr/ Mil | Hr/ Mil Rel. Life | Time (hours) | Weight Loss. (grams) | Time to 0.5% Wt Loss (hours) | Rel Life Based on 0.5% Loss | Time to 1% Wt Loss, (hours) | Rel. Life 1% Loss | Max. Attack (mils) | Hr/ Mil | Hr/ Mil Rel Life |
| V | 850.5 | 0.67 | 623 | | 20.9 | 40.7 | | 1685.5 | 0.549 | 1427 | | ~2792 | | 6.6 | 255.4 | |
| | 850.5 | 0.74 | 549 | | 8.1 | 105.0 | | 1685.5 | 0.56 | 1371 | | ~2523 | | 17.5 | 96.3 | |
| | 850.5 | 0.77 | 551 | | 7.8 | 109.0 | | 1685.5 | 0.584 | 1256 | | ~3045 | | 14.6 | 115.4 | |
| | Avg. | | 574 | 6.84× | | 84.9 | 4.49× | | Avg. | 1351 | 6.33× | ~2789 | 7.95× | Avg. | 155.7 | 3.65× |
| W | 850.5 | 1.79 | 443 | | 23.2 | 36.7 | | 1685.5 | 1.009 | 1005 | | 1619 | | 28.6 | 58.9 | |
| | 850.5 | 2.23 | 428 | | 30.4 | 28.0 | | 1685.5 | 0.948 | 1019 | | 1654 | | 20.6 | 81.8 | |
| | 850.5 | 2.42 | 402 | | 29.7 | 28.6 | | 1685.5 | 1.135 | 915 | | 1541 | | 21.6 | 78.0 | |
| | Avg. | | 424 | 5.05× | | 31.1 | 1.65× | | Avg. | 980 | 4.59× | 1605 | 4.57× | AVE | 72.9 | 1.71× |
| J | 670.5 | 1.16 | 322 | | 94.7 | 7.1 | | 1484.5 | 1.053 | 803 | | 1430 | | 27.6 | 53.8 | |
| | 670.5 | 1.05 | 330 | | 17.0 | 39.4 | | 1484.5 | 0.907 | 875 | | 1505 | | 24.1 | 61.6 | |
| | Avg. | | 326 | 3.88× | | 23.3 | 1.23× | | Avg. | 839 | 8.61× | 1468 | 4.18× | Avg. | 57.7 | 1.35× |
| Prior Art 2 | 631 | 10.4 | 74 | | 41.9 | 15.1 | | 1284.5 | 7.687 | 214 | | 330 | | 33.3 | 38.6 | |
| | 631 | 7.96 | 94 | | 27.9 | 22.6 | | 1284.5 | 6.352 | 213 | | 371 | | 27.5 | 46.7 | 1284.5 |
| | Avg. | | 84 | 1× | | 18.9 | 1× | | Avg. | 213.5 | 1× | 351 | 1× | Avg. | 42.7 | 1× |
| Prior Art 4 | 501 | 5.73 | 95 | | 37.8 | 13.3 | | 420.0 | 9.175 | 70 | | 120 | 0.34× | 59.5 | 7.1 | |
| | 381 | 7.55 | 44 | | 97.5 | 3.9 | | 883.5 | 6.497 | 193 | | 308 | 0.88× | 48.6 | 18.2 | |
| | Avg. | | 70 | .83× | | 8.6 | .46× | | Avg. | 131.5 | 0.62× | 224 | .61× | Avg. | 12.7 | 0.30× |

TABLE VIII

Creep-Rupture Properties

| | 1400 F./110 ksi | | 1800 F./36 ksi | | 2000 F./15 ksi | |
|---|---|---|---|---|---|---|
| Alloy | Rupture Life (hours) | Time to 1% Creep (hours) | Rupture Life (hours) | Time to 1% Creep (hours) | Rupture Life (hours) | Time to 1% Creep (hours) |
| W | 124* | 13.2 | 41.4 | 31.3 | 125* | 57.5 |
| | 79* | 7.0 | 55.7 | 13.1 | 126* | 64.8 |
| | 221* | 17.1 | 46.5 | 10.3 | 117* | 88.7 |
| Avg. W | 141 | 12.4 | 49.8 | 17 | 128.3 | 83.5 |
| X | 626.6 | 42.6 | 117.3 | 42.7 | 547.8 | 441.0 |
| | 591.3 | 23.5 | 116.2 | 39.3 | 623.7 | 525.0 |
| | 587.1 | 27.6 | 107.8 | 37.9 | 641.7 | 594.0 |
| Avg. X | 601.7 | 31.2 | 113.8 | 40 | 604.4 | 520.0 |
| Prior Art 3 | 256 | 7 | 90 | 35 | 110 | 50 |
| Prior Art 1 | 200 | 4 | 300 | 130 | 1400 | 800 |

*Note:
Specimens failed prematurely at the extensometer attachment points. A modified test specimen design corrected this issue for other tests.

TABLE IX

Tensile Properties

| Alloy | Temperature (° F.) | Yield Stress (ksi) | Ult. Stress (ksi) | Modulus (Msi) | Area Red. (%) | El. (%) |
|---|---|---|---|---|---|---|
| W | 70 | 118.9 | 144.7 | 19.0 | 23.0 | 21.0 |
| | | 116.8 | 143.8 | 18.8 | 30.0 | 34.0 |
| | | 124.4 | 157.7 | 19.0 | 18.0 | 18.0 |
| | Avg. | 120.0 | 148.7 | 18.9 | 23.7 | 24.3 |
| | 1200 | 116.1 | 134.9 | 16.2 | 32.0 | 21.0 |
| | | 119.3 | 142.2 | 15.8 | 26.0 | 17.0 |
| | | 123.9 | 149.1 | 15.6 | 18.0 | 14.0 |
| | Avg. | 119.8 | 142.0 | 15.9 | 25.3 | 17.3 |
| | 1400 | 132.5 | 155.3 | 14.9 | 30.0 | 11.0 |
| | | 135.2 | 157.9 | 15.0 | 21.0 | 10.0 |
| | | 122.4 | 142.5 | 15.3 | 33.0 | 11.0 |
| | Avg. | 130.0 | 151.9 | 15.1 | 28.0 | 10.7 |
| | 2100 | 22.5 | 37.8 | 8.0 | 82.0 | 34.0 |
| | | 22.0 | 36.9 | 7.7 | 83.0 | 31.0 |
| | | 22.5 | 38.0 | 7.7 | 78.0 | 31.0 |
| | Avg. | 22.3 | 37.6 | 7.8 | 81.0 | 32.0 |
| X | 70 | 128.4 | 162.0 | 18.6 | 16.0 | 14.0 |
| | | 118.5 | 140.9 | 19.3 | 23.0 | 26.0 |
| | | 126.2 | 154.8 | 18.9 | 18.0 | 14.0 |
| | | 124.4 | 152.6 | 18.9 | 19.0 | 18.0 |
| | 1200 | 132.1 | 155.2 | 15.7 | 17.0 | 12.0 |
| | | 128.5 | 155.65 | 15.64 | 28.0 | 12.0 |
| | | 134.5 | 160.5 | 15.7 | 17.0 | 13.0 |
| | Avg. | 131.7 | 157.1 | 15.7 | 20.7 | 12.3 |
| | 1400 | 137.1 | 161.5 | 15.6 | 29.0 | 10.0 |
| | | 146.9 | 166.7 | 15.0 | 22.0 | 7.5 |
| | | 136.1 | 156.82 | 15.39 | 27.0 | 7.5 |
| | Avg. | 140.0 | 161.67 | 15.31 | 26.0 | 8.3 |
| | 2100 | 28.5 | 46.8 | 8.8 | 76.0 | 28.0 |
| | | 28.6 | 46.0 | 8.4 | 77.0 | 34.0 |
| | | 29.7 | 48.2 | 8.5 | 74.0 | 31.0 |
| | Avg. | 29.0 | 47.0 | 8.6 | 75.7 | 31.0 |

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline configuration, details of such baseline may influence details of particular implementations. Accordingly, other embodiments are within the scope of the following claims.

What is claimed is:

1. An alloy comprising, by weight:
nickel (Ni) as a largest constituent;
6.0% to 7.5% chromium;
up to 0.5% cobalt;
5.3% to 6.5% aluminum;
2.6% to 3.2% rhenium;
3.7% to 7.0% tungsten;
3.7% to 7.0% tantalum; and
0.050% to 0.50% hafnium,
wherein:
a niobium content, if any, is at most impurity levels;
a molybdenum content, if any, is no more than 0.10%;
a sulfur content, if any, is no more than 5 ppm;
a carbon content, if any, is no more than 0.10%;
a combined content, if any, of elements other than nickel, chromium, cobalt, aluminum, rhenium, tungsten, tantalum, hafnium, molybdenum, if any, sulfur, if any, silicon, if any, and carbon, if any, is no more than 2.0%; and
an individual content, if any, of every element other than nickel, chromium, cobalt, aluminum, rhenium, tungsten, tantalum, hafnium, molybdenum, if any, sulfur, if any, silicon, if any, and carbon, if any, is no more than 1.0%.

2. The alloy of claim 1 comprising, by weight:
nickel (Ni) as said largest constituent;
6.0% to 7.0% chromium;
up to 0.5% cobalt;
5.4% to 6.4% aluminum;
2.8% to 3.2% rhenium;
3.8% to 6.0% tungsten;
3.8% to 6.0% tantalum; and
0.050% to 0.50% hafnium.

3. The alloy of claim 1 comprising, by weight:
nickel (Ni) as said largest constituent;
6.8% to 7.5% chromium;
up to 0.5% cobalt;
5.3% to 6.5% aluminum;
2.6% to 3.2% rhenium;
3.7% to 7.0% tungsten;
3.7% to 7.0% tantalum;
0.050% to 0.15% hafnium; and
up to 0.30% silicon.

4. The alloy of claim 1 comprising, by weight:
nickel (Ni) as said largest constituent;
6.7% to 7.5% chromium;
up to 0.5% cobalt;
5.3% to 6.5% aluminum;
2.6% to 3.2% rhenium;
3.7% to 7.0% tungsten;
3.7% to 7.0% tantalum;
0.050% to 0.15% hafnium; and
up to 0.30% silicon.

5. The alloy of claim 1 comprising, by weight:
nickel (Ni) as said largest constituent;
6.75% to 7.25% chromium;
up to 0.5% cobalt;
5.9% to 6.4% aluminum;
2.6% to 3.2% rhenium;
3.8% to 6.2% tungsten;
3.8% to 6.2% tantalum;
0.050% to 0.15% hafnium; and
up to 0.30% silicon.

6. The alloy of claim 1 wherein, by weight, one or more of:
a sulfur content, if any, is no more than 1 ppm;
the hafnium content is 0.050% to 0.15%; and
a silicon content, if any, is no more than 0.30%.

7. The alloy of claim 1 wherein, by weight:
a combined content, if any, of elements other than nickel, chromium, cobalt, aluminum, rhenium, tungsten, tantalum, hafnium, molybdenum, if any, sulfur, if any, silicon, if any, and carbon, if any, is no more than 1.0%.

8. The alloy of claim 1 wherein, by weight:
an individual content, if any, of every element other than nickel, chromium, cobalt, aluminum, rhenium, tungsten, tantalum, hafnium, molybdenum, if any, sulfur, if any, silicon, if any, and carbon, if any, is no more than 0.20%.

9. The alloy of claim 1 wherein, by weight:
the combined content of chromium, cobalt, and aluminum is 11.5% to 16.0%.

10. The alloy of claim 1 wherein, by weight:
the combined content of chromium, cobalt, and aluminum is 11.5% to 14.0%.

11. The alloy of claim 10 wherein, by weight:
the combined content of tungsten and tantalum is 8.0% to 14.0%.

12. The alloy of claim 10 wherein, by weight:
the combined content of tungsten and tantalum is 9.0% to 11.0%.

13. The alloy of claim 12 in single-crystal (SX) form.

14. The alloy of claim 1 wherein, by weight:
the combined content of rhenium, tungsten, and tantalum is 9.0% to 15.0%.

15. The alloy of claim 14 lacking niobium.

16. The alloy of claim 1 further comprising, by weight:
yttrium, lanthanum, and/or cerium up to 0.15% combined.

17. The alloy of claim 1 having an incipient melting temperature of at least 2440° F. (1338° C.).

18. The alloy of claim 1 having an incipient melting temperature of 2460° F. to 2520° F. (1349° C. to 1382° C.) in single-crystal (SX) form.

19. The alloy of claim 1 in single-crystal (SX) form.

20. The alloy of claim 1 lacking niobium.

* * * * *